(12) United States Patent
Saito et al.

(10) Patent No.: US 8,821,014 B2
(45) Date of Patent: Sep. 2, 2014

(54) TEMPERATURE SENSOR AND HEAT TREATING APPARATUS

(71) Applicants: Tokyo Electron Limited, Tokyo (JP); Fenwal Controls of Japan, Ltd., Tokyo (JP)

(72) Inventors: Takanori Saito, Oshu (JP); Koji Yoshii, Oshu (JP); Tsutomu Kurihara, Tokyo (JP); Tomoya Okamura, Tokyo (JP)

(73) Assignees: Tokyo Electron Limited, Tokyo (JP); Fenwal Controls of Japan, Ltd., Tokyo (JP)

( * ) Notice: Subject to any disclaimer, the term of this patent is extended or adjusted under 35 U.S.C. 154(b) by 0 days.

(21) Appl. No.: 13/751,653

(22) Filed: Jan. 28, 2013

(65) Prior Publication Data
US 2014/0211830 A1 Jul. 31, 2014

(30) Foreign Application Priority Data
Feb. 10, 2012 (JP) ................................ 2012-027629

(51) Int. Cl.
*G01K 7/00* (2006.01)
*G01K 7/02* (2006.01)
(52) U.S. Cl.
CPC ....................................... *G01K 7/02* (2013.01)
USPC ............................ 374/179; 374/180; 374/181
(58) Field of Classification Search
USPC .......................................... 374/179, 180, 181
See application file for complete search history.

(56) References Cited

U.S. PATENT DOCUMENTS

| | | | | |
|---|---|---|---|---|
| 8,033,717 | B2 * | 10/2011 | Kendall | 374/139 |
| 2001/0022803 | A1 * | 9/2001 | Suzuki et al. | 374/141 |
| 2012/0310440 | A1 * | 12/2012 | Darabnia et al. | 700/300 |
| 2013/0259090 | A1 * | 10/2013 | Schlipf | 374/179 |

FOREIGN PATENT DOCUMENTS

| | | |
|---|---|---|
| JP | 2001-208616 | 8/2001 |
| JP | 2002-296122 | 10/2002 |
| JP | 2008-545967 A | 12/2008 |
| WO | 2006135189 A1 | 12/2006 |

* cited by examiner

*Primary Examiner* — Lisa Caputo
*Assistant Examiner* — Jamel Williams
(74) *Attorney, Agent, or Firm* — Bacon & Thomas, PLLC

(57) ABSTRACT

A temperature detecting element is fixed reliably at an accurate position to enable improvement in a rising characteristic of a temperature and high-accuracy temperature control. Provided is a temperature sensor including a temperature detecting element detecting a temperature in a branch tube branched from a main tube and a positioning supporting mechanism positioning and supporting the temperature detecting element. Tension is applied to a cord of the temperature detecting element. The positioning supporting mechanism is supported by the tensioned cord to position and support the temperature detecting element. The positioning supporting mechanism includes a supporting tube supporting the temperature detecting element, a positioning member supporting the supporting tube and fixed at a set position, and a tensioner applying tension to the cord of the temperature detecting element.

4 Claims, 7 Drawing Sheets

TEMPERATURE SENSOR AND HEAT TREATING APPARATUS

CROSS-REFERENCE TO RELATED APPLICATION

This application claims, under 35 USC 119, priority of Japanese Application No. 2012-027629 filed on Feb. 10, 2012.

BACKGROUND OF THE INVENTION

The present invention relates to a temperature sensor and a heat treating apparatus in which a method for fixing a temperature detecting element to be attached to an inside of a protective tube has been improved.

In a conventional temperature sensor, a thermocouple as a temperature detecting element is fixed to a heat receiving body, is attached to an inside of a protective tube, and is fixed at a predetermined position as in Patent Document 1 (Japanese Patent Laid-Open No. 2002-296122) and Patent Document 2 (Japanese Patent Laid-Open No. 2001-208616), for example. The heat receiving body itself is not attached to a set position in the protective tube accurately but is attached to an inside of the protective tube together with the thermocouple.

However, in the aforementioned conventional temperature sensor, detection accuracy is improved by providing the heat receiving body, but since the heat receiving body itself is not provided at an accurate position or in an accurate direction, there is a problem in a rising characteristic of a temperature in a case where the temperature is measured with high accuracy.

Thus, when a semiconductor wafer is subjected to a heat treatment by controlling the temperature with high accuracy, a slight difference occurs between a detected temperature by the temperature sensor and an actual temperature of the semiconductor wafer, which causes a problem of not being able to perform a desired heat treatment quickly.

Also, in order to reduce the difference between the temperature characteristic of the heated object and the temperature characteristic of the temperature sensor, the heat receiving body needs to have a certain size. When the size of the heat receiving body increases, its own weight inevitably increases as well. Thus, due to an influence of the heat receiving body's own weight, it becomes difficult to arrange the heat receiving body and the thermocouple with high accuracy. Also, due to the heat receiving body's own weight, an attachment portion between the heat receiving body and the thermocouple receives a load, which may cause a problem of breakage or the like.

Also, a multipoint temperature sensor has a plurality of small diameter branch tubes branched from a large diameter main tube. Since thermocouples are provided at tip end portions of the plurality of branch tubes, there is a problem in which it is not easy to fix the thermocouples at accurate positions reliably.

The present invention has been made in consideration of the above respects, and an object of the present invention is to provide a temperature sensor and a heat treating apparatus enabling to fix a temperature detecting element reliably at an accurate position, improving a rising characteristic of a temperature, and enabling high-accuracy temperature control.

SUMMARY OF THE INVENTION

To solve such problems, a temperature sensor according to the present invention is a temperature sensor including, in a branch tube branched from a main tube, a temperature detecting element detecting a temperature and a positioning supporting mechanism positioning and supporting the temperature detecting element. Tension is applied to a cord of the temperature detecting element. The positioning supporting mechanism is supported by the tensioned cord to position and support the temperature detecting element. In a heat treating apparatus, the above temperature sensor is used as a temperature sensor performing temperature measurement for temperature control.

With the invention configured as above, a temperature detecting element is fixed reliably at an accurate position to enable improvement in a rising characteristic of a temperature and high-accuracy temperature control.

DESCRIPTION OF THE PREFERRED EMBODIMENTS

Hereinafter, a temperature sensor and a heat treating apparatus according to embodiments of the present invention will be described. The temperature sensor according to the present embodiments is improved so that a temperature detecting element can be fixed reliably at an accurate position in a protective tube for a multipoint temperature sensor and so that a position and a direction of a heat receiving body connected at a tip end of each temperature sensor in the protective tube for the multipoint temperature sensor may be adjusted and supported accurately to improve sensitivity to temperature changes. The temperature sensor according to the present invention can be applied to every temperature sensor having a configuration in which a temperature detecting element is inserted in a protective tube. The temperature sensor according to the present invention is suitable for temperature measurement or the like for temperature control of a heat treating apparatus such as a diffusion furnace in a semiconductor manufacturing apparatus. Also, the temperature sensor according to the present invention can be incorporated in various heat treating apparatuses other than the diffusion furnace.

(A) First Embodiment

Figure 1:
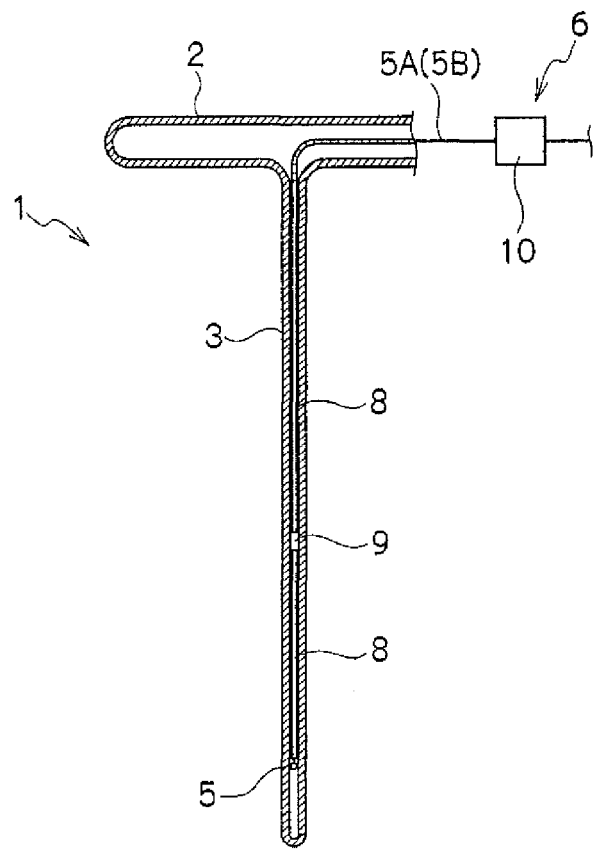
FIG. 1 is a front cross-sectional view illustrating a temperature sensor according to a first embodiment of the present invention.
Figure 2:
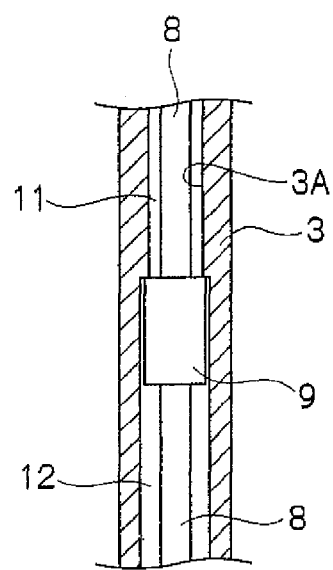
FIG. 2 is an enlarged cross-sectional view illustrating a main part of the temperature sensor according to the first embodiment of the present invention.

A temperature sensor 1 according to the present embodiment will be described based on FIGS. 1 and 2.

Since the temperature sensor 1 according to the present embodiment is a multipoint temperature sensor, the temperature sensor 1 includes a large diameter main tube 2 and a small diameter branch tube 3 branched from this main tube 2. A plurality of branch tubes 3 are provided at the main tube 2 to correspond to measurement target positions. The temperature sensor 1 is configured to mainly include a temperature detecting element 5 and a positioning supporting mechanism 6 as illustrated in the FIGS.

The temperature detecting element 5 is an element adapted to detect an ambient temperature. A known element such as a thermocouple is used as the temperature detecting element 5. The temperature detecting element 5 which is the thermocouple is provided at a tip end portion of the branch tube 3. Cords 5A and 5B extend from this temperature detecting element 5. The cords 5A and 5B extend to a side of a temperature measuring instrument (not shown) via the branch tube 3 and the main tube 2.

The positioning supporting mechanism 6 includes a supporting tube 8 adapted to support the temperature detecting element 5, a positioning member 9 adapted to support the supporting tube 8 and be fixed at a set position of the branch tube 3, and a tensioner 10 adapted to apply tension to the cord 5A.

The supporting tube 8 is a tube member adapted to support the temperature detecting element 5 and regulate a position of this temperature detecting element 5 accurately. The supporting tube 8 is made of a highly rigid tube member such as a ceramic tube. By doing so, the supporting tube 8 is supported by the positioning member 9 to position the temperature detecting element 5 with reference to this positioning member 9. That is, positioning the positioning member 9 accurately causes a tip end portion of the highly rigid supporting tube 8 supported by this positioning member 9 to be positioned accurately as well. Thus, the temperature detecting element 5 at a tip end of the supporting tube 8 is positioned accurately as well.

The positioning member 9 is a member adapted to position the temperature detecting element 5 as described above. The branch tube 3 is made of a hollow-centered tube member and has at a center thereof an inserting hole 3A adapted to insert the temperature detecting element 5 and the like therein. This inserting hole 3A is formed to have a circular cross-section. The inserting hole 3A is also provided at a set position at which the positioning member 9 is to be supported (a position for accurate positioning) with a step. That is, by changing an inner diameter of the inserting hole 3A at the set position, the step is provided in this inserting hole 3A. With this step as a border, a base end side (an upper side in FIG. 2) is a supporting tube inserting hole 11 while a tip end side (a lower side in FIG. 2) is a positioning member supporting hole 12. This enables the positioning member 9 to move only on the tip end side of the branch tube 3. The positioning member supporting hole 12 is provided up to the set position so as to support the positioning member 9 at the set position. By doing so, the positioning member 9 is positioned accurately in a state of being located at an end portion (the aforementioned step) in the positioning member supporting hole 12 (a state in FIG. 2).

The tensioner 10 is a mechanism adapted to apply tension to the cords 5A and 5B with set force (normally, weak force). As the tensioner 10, known ones with various configurations can be used. For example, known tensioners 10 such as one applying tension with use of elastic force of a spring and one with use of electromagnetic force can be used. Also, by fixing the cords 5A and 5B in a state of applying certain tension to the cords 5A and 5B, tension may be applied to the cords 5A and 5B.

Figure 3:
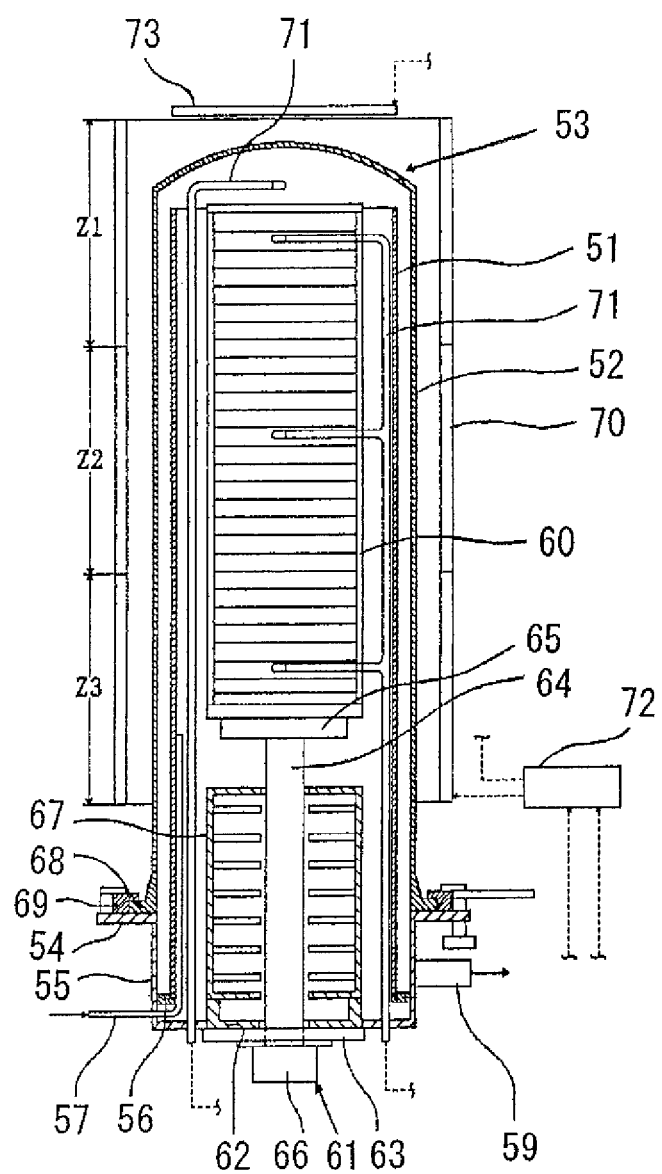
FIG. 3 is a schematic cross-sectional view illustrating a vertical heat treating apparatus in which the temperature sensor according to the first embodiment of the present invention has been incorporated.

The temperature sensor 1 configured as above is incorporated in a heat treating apparatus. An example of the heat treating apparatus will be described based on FIG. 3. Here, a vertical heat treating apparatus adapted for a heat treatment of a semiconductor wafer is taken as an example. This vertical heat treating apparatus includes a treating container (process tube) 53 having a double-tube structure consisting of a straight-tube-like inner tube 51 arranged to extend in a height direction (up-down direction in FIG. 3) and opened at an upper end thereof and an outer tube 52 arranged concentrically around the inner tube 51 with a predetermined space in-between and closed at an upper end thereof, and a lower space of the treating container 53 is a loading area L in which transfer and the like of a semiconductor wafer as a treated body to an after-mentioned wafer boat 60 as a treated body holding tool are performed. The inner tube 51 and the outer tube 52 are made of a material excellent in heat resistance and corrosion resistance such as high-purity quartz glass.

A lower end portion of the outer tube 52 in this treating container 53 is provided with a short cylindrical manifold 55 having a flange portion 54 at an upper end thereof. To the flange portion 54 is connected by a flange holder 69 a lower end flange portion 68 provided at a lower end portion of the outer tube 52 via a sealing means (not shown) such as an O ring to bring a state in which the outer tube 52 of the treating container 53 is fixed. The inner tube 51 in the treating container 53 extends downward from a lower end surface of the outer tube 52 and is supported by an annular inner tube supporting portion 56 provided on an inner surface of the manifold 55 in a state of being inserted in the manifold 55.

On a vertical cross-section of the treating container 53 of this vertical heat treating apparatus, one sidewall of the manifold 55 is provided with a gas supply pipe 57 adapted to introduce treating gas and inert gas in the treating container 53. To this gas supply pipe 57 is connected a not illustrated gas supply source. Also, the other sidewall of the manifold 55 is provided with an exhaust portion 59 adapted to exhaust gas in the treating container 53. To this exhaust portion 59 is connected an exhaust mechanism (not shown) having a vacuum pump and a pressure control mechanism, for example, to cause the inside of the treating container 53 to be controlled at predetermined pressure.

On a lower side of the treating container 53 is provided an elevating mechanism 61 driven in an up-down direction to carry the wafer boat 60 as a treated body holding tool in and out of the treating container 53, and the elevating mechanism 61 has a circular-plate-shaped lid 63 adapted to open and close a lower end opening 62 of the treating container 53. The wafer boat 60 is made of high-purity quartz glass, for example. In the wafer boat 60, a plurality of semiconductor wafers such as 100 to 150 semiconductor wafers are mounted in parallel on multiple stages at predetermined pitches vertically such as 5.2 to 20.8 mm.

The lid 63 in the elevating mechanism 61 is provided with a columnar supporting member 64 extending upward in parallel with the treating container 53 in a state of penetrating the lid 63. This supporting member 64 is provided integrally with a circular-plate-shaped boat support 65 on which the wafer boat 60 is to be mounted and is connected to a rotary driving means 66 provided at a lower portion of the lid 63. Also, at an upper portion of the lid 63 is provided a heat-retention cylinder 67 made of quartz, for example, in a state in which the supporting member 64 is inserted therein.

On an outside of the treating container 53 is provided a cylindrical heater 70 as a heating means adapted to heat the semiconductor wafers housed in the treating container 53 at a predetermined treating temperature in a state of surrounding a circumference of the treating container 53. The cylindrical heater 70 is provided with a cylindrical heat insulating material (not shown) on an inner surface of which a linear resistance heating element is arranged in a spiral manner or in a serpentine manner. The resistance heating element is connected to a control unit 72 adapted to control magnitude of electric power to be supplied so that the semiconductor wafers may be in a state of a preset temperature based on temperature data of the semiconductor wafers detected by a temperature detector 71.

By dividing the treating container 53 into a plurality of heating zones such as three heating zones Z1 to Z3 in the illustrated example in a height direction, this cylindrical heater 70 is in a state of enabling independent temperature control for the respective heating zones, that is, in a state of enabling zone control.

On an upper side of the treating container 53 is provided a sheet-like heater 73 arranged in parallel with an upper end surface of the cylindrical heater 70 in a state of being opposed to the wafer boat 60 in the treating container 53. By doing so, heat dissipation from an upper side of the treating container 53 is prevented efficiently, and the semiconductor wafers can be subjected to a heat treatment with high in-plane uniformity. The sheet-like heater 73 is made by providing a linear resistance heating element on a plate-like base material, for example, and this resistance heating element is connected to the control unit 72.

In the vertical heat treating apparatus configured as above, the control unit 72 controls the cylindrical heater 70, the sheet-like heater 73, and the like to make the wafer boat 60 subjected to a heat treatment.

In this vertical heat treating apparatus, the temperature sensor 1 according to the present embodiment is arranged as the temperature detector 71.

In this temperature sensor 1, the cord 5A, to which tension has been applied by the tensioner 10, is pulled to a base end side of the main tube 2, and the positioning member 9 is pulled to a base end side (upper side in FIG. 1) in the branch tube 3.

Thus, the positioning member 9 is pulled upward and is supported at an upper end portion of the positioning member supporting hole 12. By doing so, the positioning member 9 is positioned.

The positioning member 9 positioned by the tensioner 10 and the positioning member supporting hole 12 supports the temperature detecting element 5 via the supporting tube 8. Thus, the temperature detecting element 5 is positioned accurately.

Positioning of the temperature detecting element 5 is performed in every branch tube 3. Subsequently, the temperature sensor 1 is incorporated in a diffusion furnace or the like.

In the above manner, the temperature detecting element can be fixed reliably at an accurate position. Thus, the temperature detecting element 5 can follow surrounding temperature changes quickly and improve a rising characteristic of a temperature. Consequently, high-accuracy temperature control is enabled.

(B) Second Embodiment

Next, a second embodiment of the present invention will be described.

Figure 4:
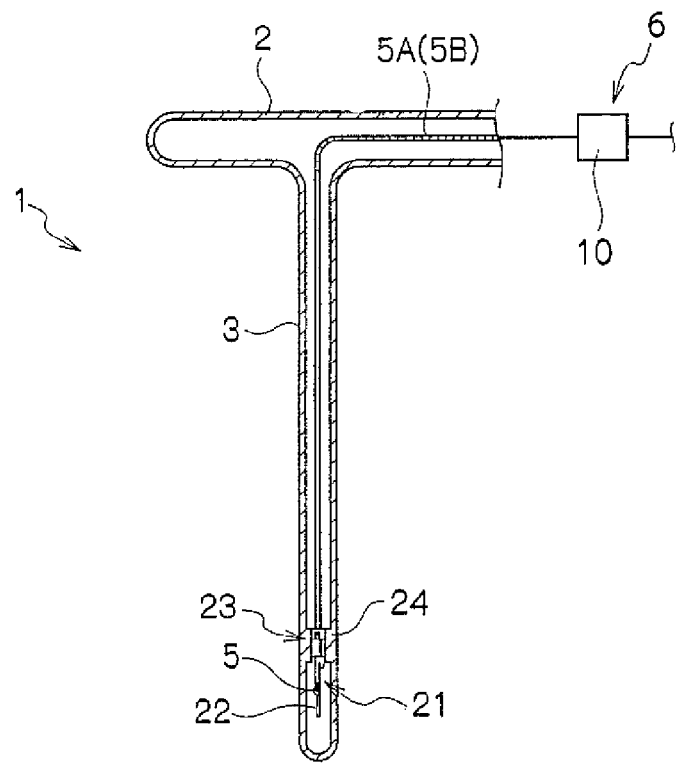
FIG. 4 is a front cross-sectional view illustrating a temperature sensor according to a second embodiment of the present invention.
Figure 5:
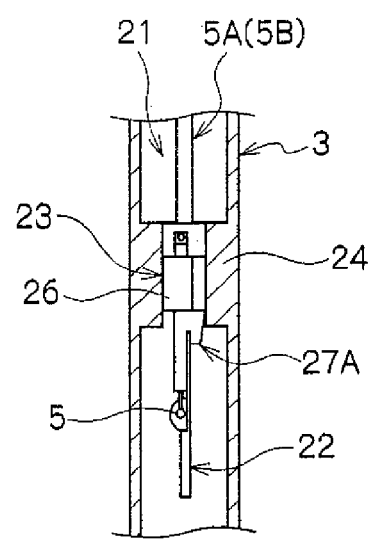
FIG. 5 is an enlarged cross-sectional view illustrating a main part of the temperature sensor according to the second embodiment of the present invention.
Figure 6:
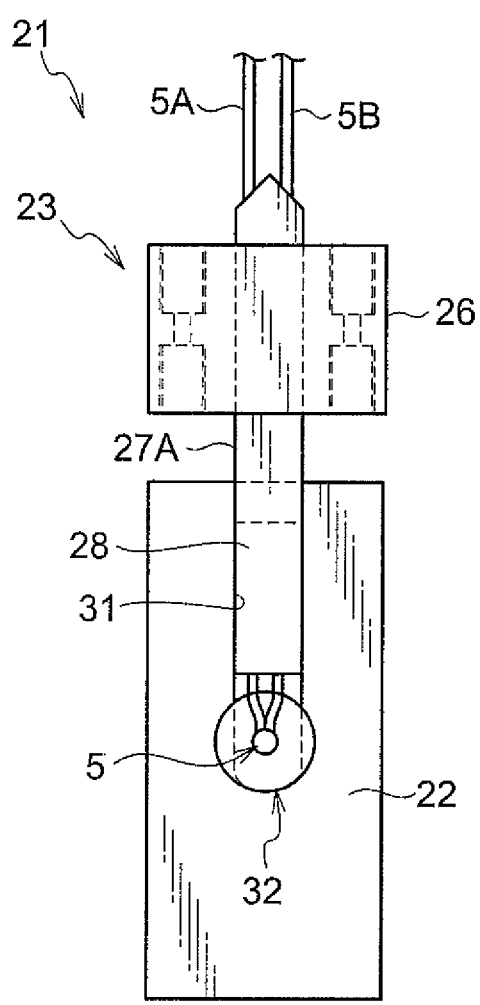
FIG. 6 is a front view illustrating a main part of the temperature sensor according to the second embodiment of the present invention.
Figure 7:
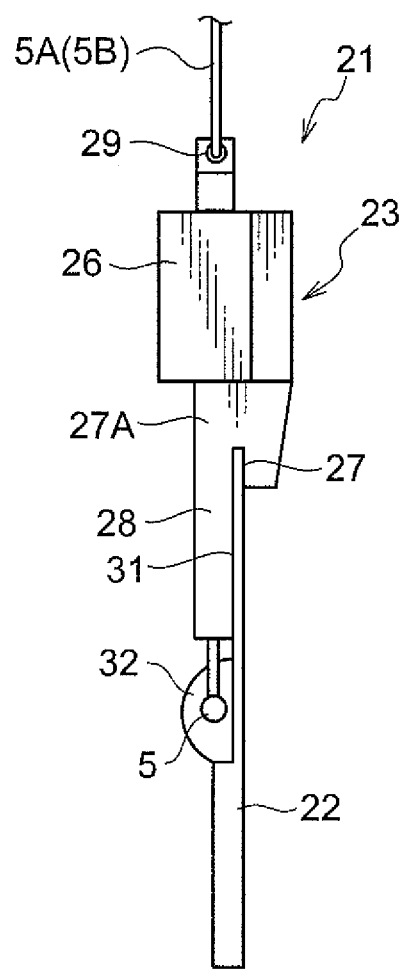
FIG. 7 is side view illustrating a main part of the temperature sensor according to the second embodiment of the present invention.
Figure 8:
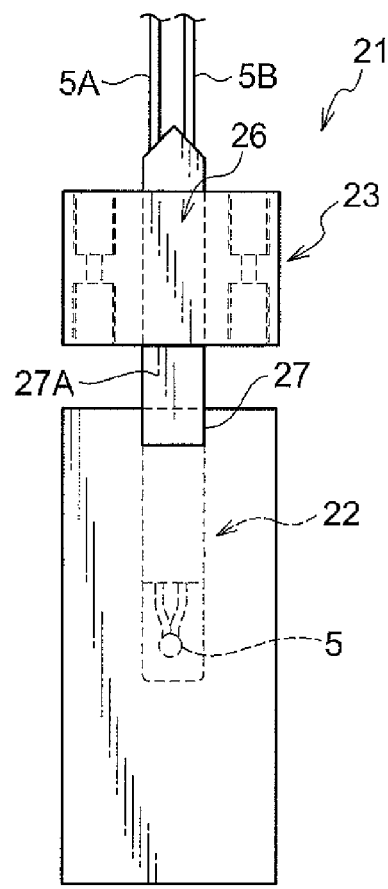
FIG. 8 is a back view illustrating a main part of the temperature sensor according to the second embodiment of the present invention.

The present embodiment is characterized by providing a temperature detecting element supporting portion 21. As illustrated in FIGS. 4 and 5, the temperature detecting element supporting portion 21 supports a heat receiving body 22 to which the temperature detecting element 5 is fixed in a cantilevered manner to fix the temperature detecting element 5 at an accurate position.

The temperature detecting element supporting portion 21 is provided at a tip end portion of the branch tube 3. The temperature detecting element supporting portion 21 includes the heat receiving body 22, a positioning supporting mechanism 23, a supporting portion 24, and the tensioner 10.

The heat receiving body 22 is a plate member adapted to fix the temperature detecting element 5 at a predetermined position, be supported at a set position, and be heated by external heat. The heat receiving body 22 fixes the temperature detecting element 5 and is supported at a test target position accurately. The heat receiving body 22 is also provided toward the test target position and is heated by receiving heat transmitted from this test target position. Thus, the heat receiving body 22 follows heat changes at the test target position quickly and transmits the heat to the temperature detecting element 5.

The positioning supporting mechanism 23 is a mechanism adapted to support the temperature detecting element 5 and the heat receiving body 22 at accurate positions. The positioning supporting mechanism 23 is attached to a set position in the branch tube 3 by the supporting portion 24.

As illustrated in FIGS. 4 to 8, the positioning supporting mechanism 23 includes a main body supporting portion 26 supported by the supporting portion 24, a supporting recess 27 adapted to be fitted to an end portion of the heat receiving body 22 and support the heat receiving body 22 in a cantilevered manner, a supporting piece 28 constituting one surface of this supporting recess 27 and extending this surface to support one side surface of the heat receiving body 22, and cord holes 29 provided in this supporting piece 28 and an after-mentioned member 27A to make the cords 5A and 5B of the temperature detecting element 5 pass therethrough.

The main body supporting portion 26 is formed in a hexagonal columnar shape. The main body supporting portion 26 may be in another shape such as another polygonal columnar shape or an elliptic columnar shape. Thus, the main body supporting portion 26 is fitted in the supporting portion 24 to be supported at a set position accurately and firmly by this supporting portion 24.

The supporting recess 27 is a recess adapted to support the heat receiving body 22 accurately. The supporting recess 27 is provided on a tip end side of the thick-plate-like member 27A extending in a longitudinal direction of the branch tube 3 from the main body supporting portion 26. The supporting recess 27 is provided at an accurate position on the tip end side of the member 27A. By doing so, one end portion of the heat receiving body 22 is fitted in the supporting recess 27 and is supported by the supporting recess 27, and by applying tension to the cords 5A and 5B, the heat receiving body 22 is reliably fitted in the supporting recess 27 and is accurately positioned without positional displacement.

The supporting piece 28 supports one side surface of the heat receiving body 22, and the one side surface of the heat receiving body 22 is provided with a fitting recess 31 in which the supporting piece 28 is to be fitted. The fitting recess 31 is formed to have an approximately equal width to a width of the supporting piece 28. By doing so, the fitting recess 31 supports the supporting piece 28 so as not to shift in a right-left direction in FIGS. 6 and 8. At a tip end of the supporting piece 28, the temperature detecting element 5 is fixed to the heat receiving body 22 by adhesive 32 or the like. This prevents the heat receiving body 22 from shifting in front-back, right-left, and up-down directions of the supporting recess 27 and the supporting piece 28. Additionally, by the cords 5A and 5B which are made to pass through the cord holes 29 and to which tension is applied by the tensioner 10, the heat receiving body 22 is supported by the supporting recess 27 and the supporting piece 28 reliably without shifting.

The cord holes 29 are holes adapted to arrange the cords 5A and 5B from the temperature detecting element 5 to a side of the tensioner 10. The cord holes 29 are provided to penetrate the aforementioned member 27A and the supporting piece 28. By the cords 5A and 5B made to pass through these cord holes 29, the heat receiving body 22 is adapted to be pulled to a side of the supporting recess 27 and the supporting piece 28 and be supported.

The tensioner 10 is similar to the aforementioned tensioner 10 in the first embodiment. By this tensioner 10, certain tension is applied to the cords 5A and 5B.

The supporting portion 24 is a member adapted to support the positioning supporting mechanism 23. The supporting portion 24 raises an inner wall of the branch tube 3 inward and is formed to correspond to a shape of the main body supporting portion 26 of the positioning supporting mechanism 23. Specifically, the supporting portion 24 is in a hexagonal hole shape to correspond to the hexagonal shape of the main body supporting portion 26 or in a rectangular hole shape contacting and supporting four surfaces out of the hexagonal main body supporting portion 26. In the supporting portion 24 formed in this shape, the main body supporting portion 26 of the positioning supporting mechanism 23 is fixed at a set position, keeping a position and a direction thereof accurately. This set position is provided with a stopper, a step (not shown), or the like as needed, and the main body supporting portion 26 of the positioning supporting mechanism 23 abuts on this stopper, so that the main body supporting portion 26 may be fixed at the set position with the position and the direction of the positioning supporting mechanism 23 kept accurately.

The temperature sensor configured as above can exert similar effects to those of the first embodiment and can position and support the heat receiving body 22 (temperature detecting element 5) more accurately by the supporting recess 27, the supporting piece 28, and the like.

Also, a supporting structure of the supporting piece is simplified. Heat receiving bodies 22 having various dimensions can be supported easily regardless of the differences of the dimensions of the heat receiving bodies 22.

Also, in the above respective embodiments, since tension is applied to the cords 5A and 5B, it is possible to prevent the heat receiving body 22 (temperature detecting element 5) from shifting by vibration and the like, and reliability of the temperature sensor is improved.

Also, even when a size of the heat receiving body 22 is increased to some extent, and its own weight is increased in order to reduce a difference between a temperature characteristic of a heated object as a treating target and a temperature characteristic of the temperature sensor, the heat receiving body 22 is supported at a predetermined position and in a predetermined direction accurately and reliably by the positioning supporting mechanism 23. Thus, the temperature detecting element 5 and the heat receiving body 22 can be arranged with high accuracy, and temperature measurement can be performed with high accuracy.

(C) Modification

Figure 9:
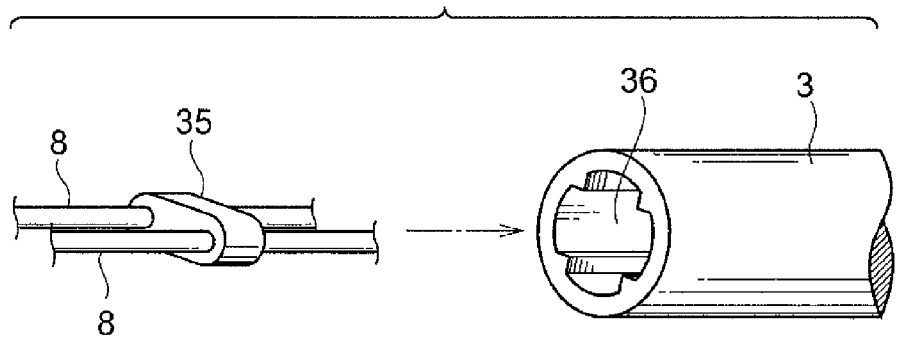
FIG. 9 is a perspective view illustrating a first modification example of the present invention.

In the above first embodiment, although the positioning member 9 is formed to have a circular cross-section, the positioning member 9 may be formed in another shape such as an elliptic shape or a polygonal shape. The positioning member supporting hole 12 is also in another shape such as an elliptic shape or a polygonal shape to correspond to the positioning member 9. Also, although the first embodiment has a configuration in which the supporting tube 8 supports a range from the positioning member 9 to the temperature detecting element 5, a supporting means supporting the supporting tube 8 may be provided between the positioning member and the temperature detecting element 5. For example, as illustrated in FIG. 9, a positioning member 35 supporting the supporting tube 8 may be provided. This positioning member 35 is formed to have an elliptic cross-section to prevent rotation. The cross-section of the positioning member 35 may be in another shape such as a rectangle. To correspond to this, a positioning member supporting hole 36 is formed to be a hole formed by combining a vertical elliptic hole with a horizontal elliptic hole. In a case where the positioning member 35 is not in an elliptic shape, shapes of the vertical and horizontal holes are set to correspond to another shape such as a rectangle. By doing so, the positioning member 35 can be inserted in the positioning member supporting hole 36 in a vertical direction or in a horizontal direction as needed. Thus, the temperature detecting element 5 can be supported with a position and a direction thereof adjusted accurately. Especially in a case where a heat receiving body is provided, a direction thereof can be adjusted accurately.

Figure 10:
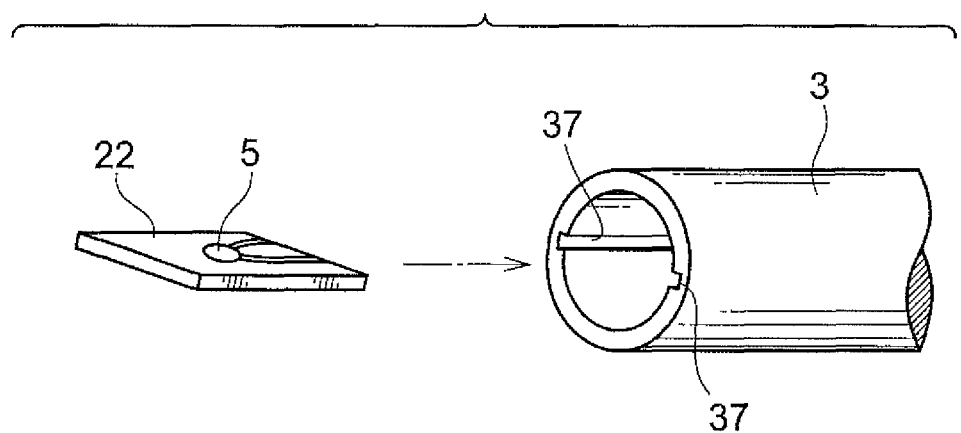
FIG. 10 is a perspective view illustrating a second modification example of the present invention.

Also, as illustrated in FIG. 10, the heat receiving body 22 may be used as it is. That is, a slit 37 allowing the heat receiving body 22 to be fitted therein may be provided on an inner wall of the branch tube 3 to insert the heat receiving body 22 in this slit 37.

Also, although a case in which the temperature detecting element 5 is mounted in a protective tube of a multipoint temperature sensor has been taken as an example in the above respective embodiments, the present invention can be applied to a temperature sensor other than the multipoint temperature sensor as long as the temperature sensor includes the branch tube 3.

The present invention is not limited to the above respective embodiments as they are but can be embodied in a practical phase by altering the respective components without departing from the spirit and scope thereof. Also, various inventions can be formed by appropriate combination of plural components disclosed in the above respective embodiments. For example, several components may be deleted from all the components shown in an embodiment. Also, components in different embodiments may be combined as needed.

The invention claimed is:

1. A temperature sensor comprising:
a temperature detecting element detecting a temperature in a branch tube branched from a main tube; and
a positioning supporting mechanism positioning the temperature detecting element in the branch tube and supporting the temperature detecting element,
wherein the temperature detecting element has a cord to which tension is applied,
wherein the positioning supporting mechanism is supported by the tensioned cord to position and support the temperature detecting element, and
wherein the positioning supporting mechanism includes a supporting tube supporting the temperature detecting element, a positioning member supporting the supporting tube and fixed at a set position, and a tensioner applying tension to the cord of the temperature detecting element.

2. The temperature sensor according to claim 1, wherein the positioning supporting mechanism includes a main body supporting portion supported by a supporting portion in the branch tube, a supporting recess fitted to an end portion of a heat receiving body supporting the temperature detecting element and supporting the heat receiving body in a cantilevered manner, a supporting piece constituting one surface of the supporting recess and extending this surface to support one side surface of the heat receiving body, and a cord hole provided in the supporting piece to make the cord of the temperature detecting element pass therethrough.

3. A heat treating apparatus performing a heat treatment by controlling a temperature of a target, wherein the temperature sensor according to claim 1 is used as a temperature sensor performing temperature measurement for control of the temperature.

4. A heat treating apparatus performing a heat treatment by controlling a temperature of a target, wherein the temperature sensor according to claim 2 is used as a temperature sensor performing temperature measurement for control of the temperature.

* * * * *